United States Patent
Wu

(10) Patent No.: US 9,102,020 B2
(45) Date of Patent: Aug. 11, 2015

(54) MANUFACTURING METHOD OF THIN HEAT PIPE

(71) Applicant: ASIA VITAL COMPONENTS CO., LTD., Sinjhuang District, New Taipei (TW)

(72) Inventor: Chun-Ming Wu, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 224 days.

(21) Appl. No.: 13/732,415

(22) Filed: Jan. 1, 2013

(65) Prior Publication Data

US 2014/0150263 A1    Jun. 5, 2014

(30) Foreign Application Priority Data

Dec. 4, 2012  (TW) .............................. 101145379 A

(51) Int. Cl.
| | |
|---|---|
| B23P 6/00 | (2006.01) |
| B23P 15/26 | (2006.01) |
| H01L 23/427 | (2006.01) |
| F28D 15/04 | (2006.01) |
| B21C 37/15 | (2006.01) |

(52) U.S. Cl.
CPC ............... *B23P 15/26* (2013.01); *B21C 37/154* (2013.01); *B21C 37/155* (2013.01); *B21C 37/158* (2013.01); *F28D 15/046* (2013.01); *H01L 23/427* (2013.01); *B23P 2700/09* (2013.01); *H01L 2924/0002* (2013.01); *Y10T 29/49353* (2015.01)

(58) Field of Classification Search
USPC ..................... 29/890.032; 165/104.21, 104.26
See application file for complete search history.

(56) References Cited

U.S. PATENT DOCUMENTS

| | | | |
|---|---|---|---|
| 3,680,189 A * | 8/1972 | Noren ....................... | 29/890.032 |
| 6,896,040 B2 * | 5/2005 | Hul-Chun ................. | 165/104.26 |
| 2014/0060781 A1 * | 3/2014 | Jia et al. ................... | 165/104.26 |

* cited by examiner

*Primary Examiner* — Richard Chang
(74) *Attorney, Agent, or Firm* — C. G. Mersereau; Nikolai & Mersereau, P.A.

(57) ABSTRACT

A manufacturing method of thin heat pipe includes steps of: providing a hollow tubular body and a mesh capillary structure; placing the mesh capillary structure into the tubular body; providing a tool and placing the tool into the mesh capillary structure; sintering the tubular body to make the mesh capillary structure sintered on an inner wall face of the tubular body and then taking out the tool; vacuuming the tubular body and filling a working fluid into the tubular body; sealing the tubular body; and pressing and flattening the tubular body into a flat form by means of mechanical processing. According to the manufacturing method of thin heat pipe, the mesh capillary structure can fully tightly attach to the inner wall face of the tubular body to keep the completeness of the tubular body and the completeness of the vapor-liquid circulation passageways in the heat pipe.

5 Claims, 8 Drawing Sheets

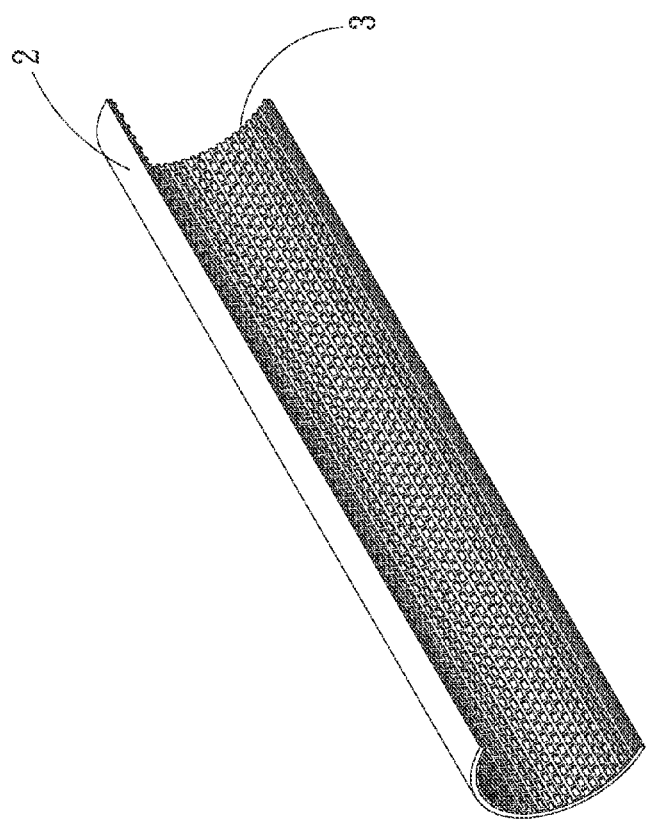
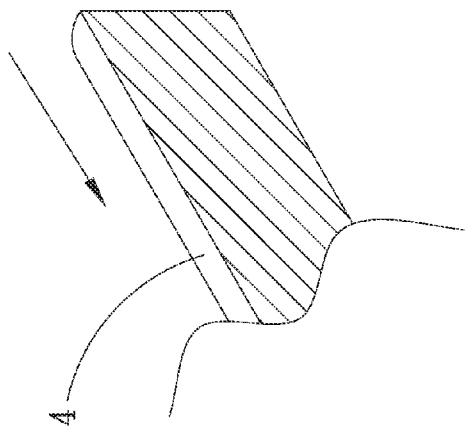
Fig.6

MANUFACTURING METHOD OF THIN HEAT PIPE

This application claims the priority benefit of Taiwan patent application number 101145379 filed on Dec. 4, 2012.

BACKGROUND OF THE INVENTION

1. Field of the Invention

The present invention relates generally to a manufacturing method of thin heat pipe, and more particularly to a manufacturing method of thin heat pipe, in which the mesh capillary structure is prevented from being deformed due to pressing. Therefore, the thermal conductivity of the heat pipe will not be affected.

2. Description of the Related Art

A heat pipe has heat conductivity several times to several tens times that of copper, aluminum or the like. Therefore, the heat pipe has excellent performance and serves as a cooling component applied to various electronic devices. As to the configuration, the conventional heat pipes can be classified into heat pipes in the form of circular tubes and heat pipes in the form of flat plates. For cooling an electronic component such as a CPU, preferably a flat-plate heat pipe is used in view of easy installation and larger contact area. To catch up the trend toward miniaturization of cooling mechanism, the heat pipe has become thinner and thinner in adaptation to the cooling mechanism.

The heat pipe is formed with an internal space as a flow path for the working fluid contained in the heat pipe. The working fluid is converted between liquid phase and vapor phase through evaporation and condensation and is transferable within the heat pipe for transferring heat. The heat pipe is formed with sealed voids in which the working fluid is contained. The working fluid is phase-changeable and transferable to transfer heat.

The heat pipe is used as a heat conduction member. The heat pipe is fitted through or plug-in connected with a radiating fin assembly. The working fluid with low boiling point is filled in the heat pipe. The working fluid absorbs heat from a heat-generating electronic component (at the evaporation end) and evaporates into vapor. The vapor goes to the radiating fin assembly and transfers the heat to the radiating fin assembly (at the condensation end). A cooling fan then carries away the heat to dissipate the heat generated by the electronic component.

Currently, there are many methods for manufacturing the heat pipes. For example, the heat pipe can be manufactured in such a manner that metal powder is filled into a hollow tubular body and sintered to form a capillary structure layer on the inner wall face of the tubular body. Then the tubular body is vacuumed and filled with the working fluid and then sealed. Alternatively, a mesh capillary structure body is placed into a tubular body and sintered to form a capillary structure layer on the inner wall face of the tubular body. Then the tubular body is vacuumed and filled with the working fluid and then sealed. On the demand of the electronic equipment for slim configuration, the heat pipe must be made with a thin configuration.

Please refer to FIG. 1, which is a sectional view of a thin heat pipe made by means of a conventional thin heat pipe manufacturing method. In the conventional technique, a mesh capillary structure body 12 is placed into a hollow tubular body 11. Then the tubular body 11 is pressed into a flat form. Then the hollow tubular body is 11 vacuumed and filled with the working fluid. Finally, the hollow tubular body 11 is sealed. According to such process, the hollow tubular body 11 can be made with a flat configuration. However, when flattening the hollow tubular body 11, the mesh capillary structure body 12 is not fully attached to the inner wall face of the hollow tubular body 11 or even is detached from the inner wall face along the junction between the mesh capillary structure body 12 and the inner wall face. Accordingly, when flattening the hollow tubular body 11, the mesh capillary structure body 12 is often deformed and cannot be fully tightly attached to the inner wall face of the hollow tubular body 11. In some more serious cases, the mesh capillary structure body 12 will be even detached from the inner wall face. As a result, the hollow tubular body 11 can be hardly completely flattened and the completeness of the vapor-liquid circulation passageways in the heat pipe will be affected. This will lead to deterioration of the thermal conductivity.

According to the above, the conventional technique has the following shortcomings:

1. The mesh capillary structure body is likely to deform.
2. The hollow tubular body can be hardly completely flattened.
3. The completeness of the vapor-liquid circulation passageways in the heat pipe will be affected.
4. The thermal conductivity is deteriorated.

SUMMARY OF THE INVENTION

It is therefore a primary object of the present invention to provide a manufacturing method of thin heat pipe, in which the mesh capillary structure is prevented from being deformed due to pressing. Therefore, the thermal conductivity of the heat pipe will not be affected.

It is a further object of the present invention to provide the above manufacturing method of thin heat pipe, in which after pressed and flattened, the mesh capillary structure can still fully tightly attach to the inner wall face of the tubular body to keep the completeness of the tubular body and the completeness of the vapor-liquid circulation passageways in the heat pipe. Accordingly, the heat conduction efficiency of the thin heat pipe can be enhanced.

To achieve the above and other objects, the manufacturing method of thin heat pipe of the present invention includes steps of:

providing a hollow tubular body and a mesh capillary structure;

placing the mesh capillary structure into the tubular body;

providing a tool and placing the tool into the mesh capillary structure;

sintering the tubular body to make the mesh capillary structure sintered on an inner wall face of the tubular body and then taking out the tool;

pressing and flattening the tubular body into a flat form;

vacuuming the tubular body and filling a working fluid into the tubular body; and sealing the tubular body.

Alternatively, the manufacturing method of thin heat pipe of the present invention steps of:

providing a hollow tubular body and a mesh capillary structure;

placing the mesh capillary structure into the tubular body;

providing a tool and placing the tool into the mesh capillary structure;

sintering the tubular body to make the mesh capillary structure sintered on an inner wall face of the tubular body and then taking out the tool;

vacuuming the tubular body and filling a working fluid into the tubular body;

sealing the tubular body by means of mechanical processing; and pressing and flattening the tubular body into a flat form by means of mechanical processing.

According to the manufacturing method of thin heat pipe of the present invention, after pressed and flattened into a thin form, the mesh capillary structure can still fully tightly attach to the inner wall face of the tubular body to keep the completeness of the tubular body and the completeness of the vapor-liquid circulation passageways in the heat pipe. Therefore, the mesh capillary structure is prevented from being deformed and detached from the inner wall face of the tubular body due to pressing. Therefore, the thermal conductivity of the thin heat pipe will not be affected and the heat conduction efficiency of the thin heat pipe can be greatly enhanced.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein:

FIG. 6 is a perspective view showing a fourth step of the manufacturing method of thin heat pipe of the present invention;

DETAILED DESCRIPTION OF THE PREFERRED EMBODIMENTS

Figure 1:
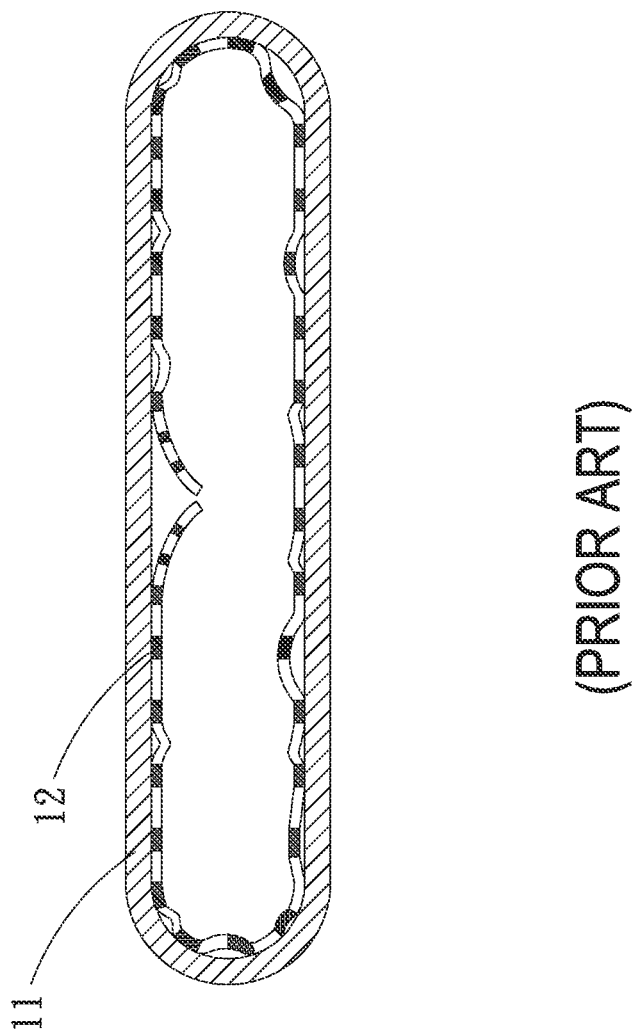
FIG. 1 is a sectional view of a thin heat pipe made by means of a conventional thin heat pipe manufacturing method.
Figure 2:
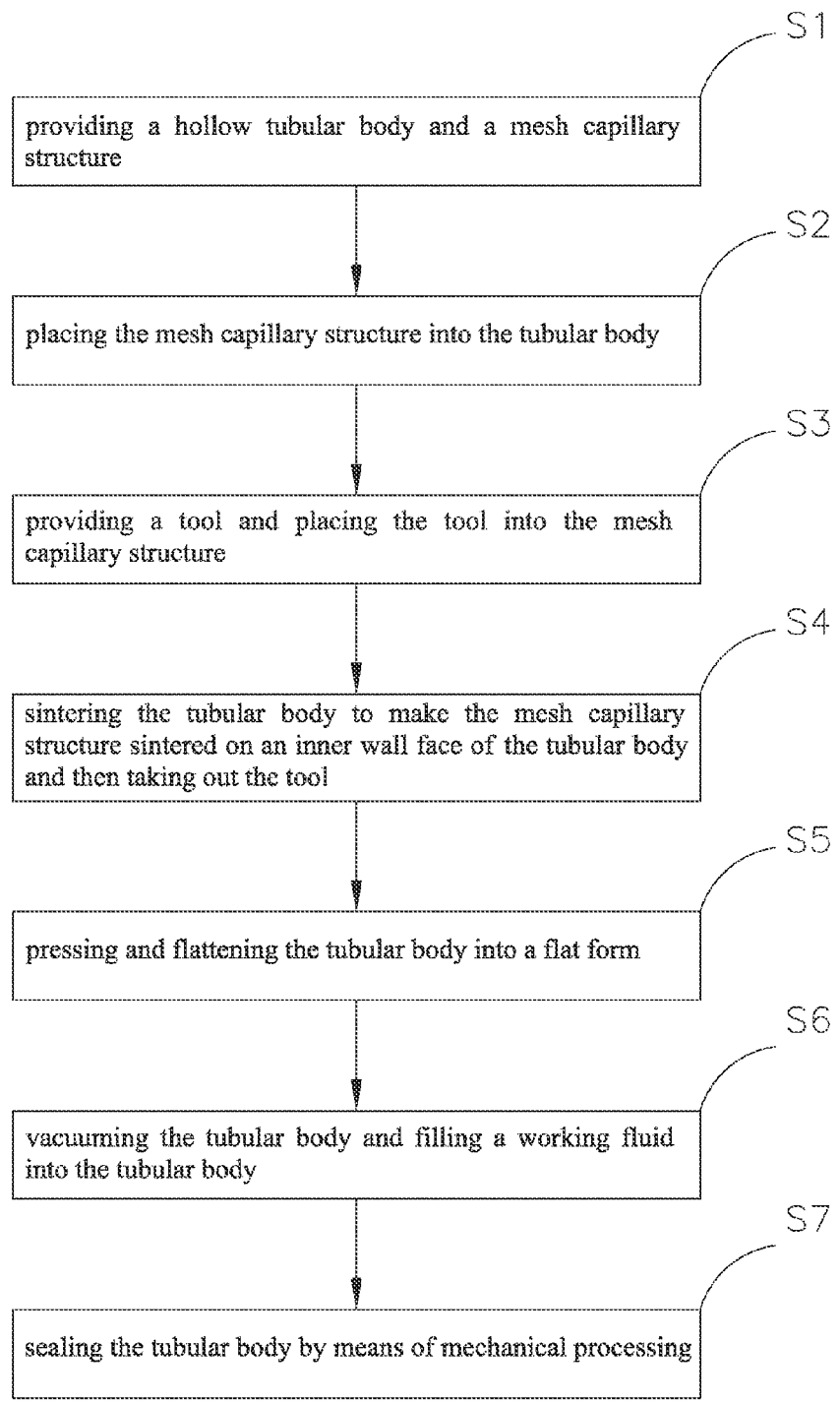
FIG. 2 is a flow chart of the manufacturing method of thin heat pipe of the present invention.
Figure 3:
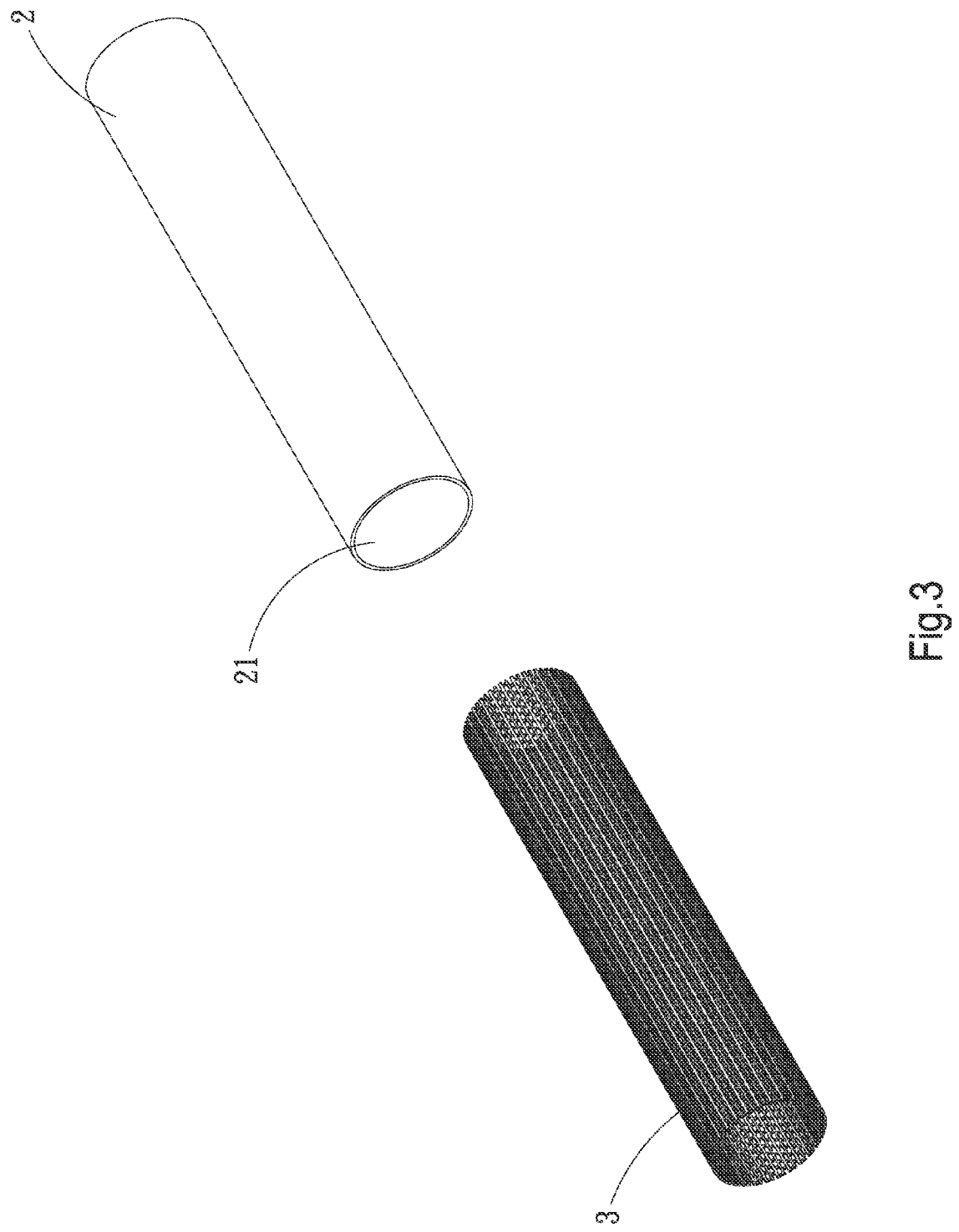
FIG. 3 is a perspective view showing a first step of the manufacturing method of thin heat pipe of the present invention.
Figure 4:
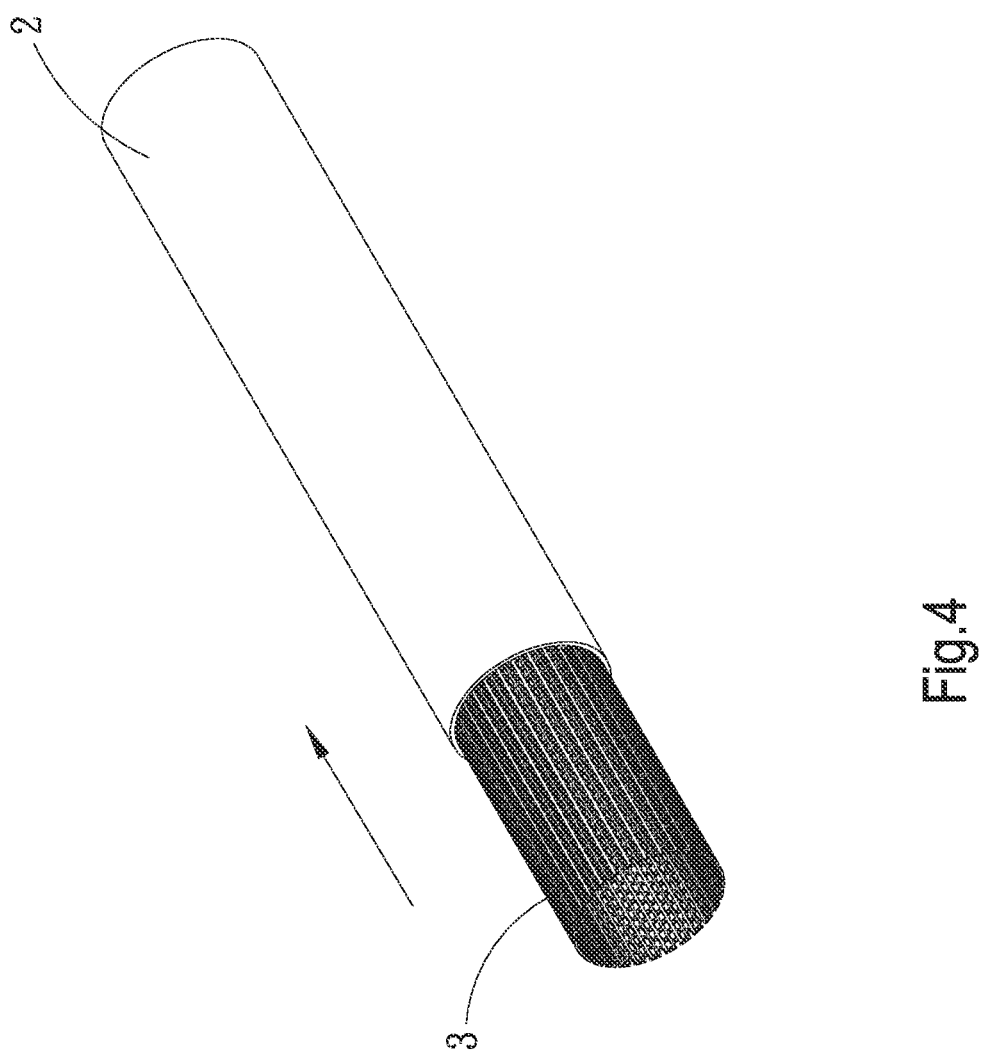
FIG. 4 is a perspective view showing a second step of the manufacturing method of thin heat pipe of the present invention.
Figure 5:
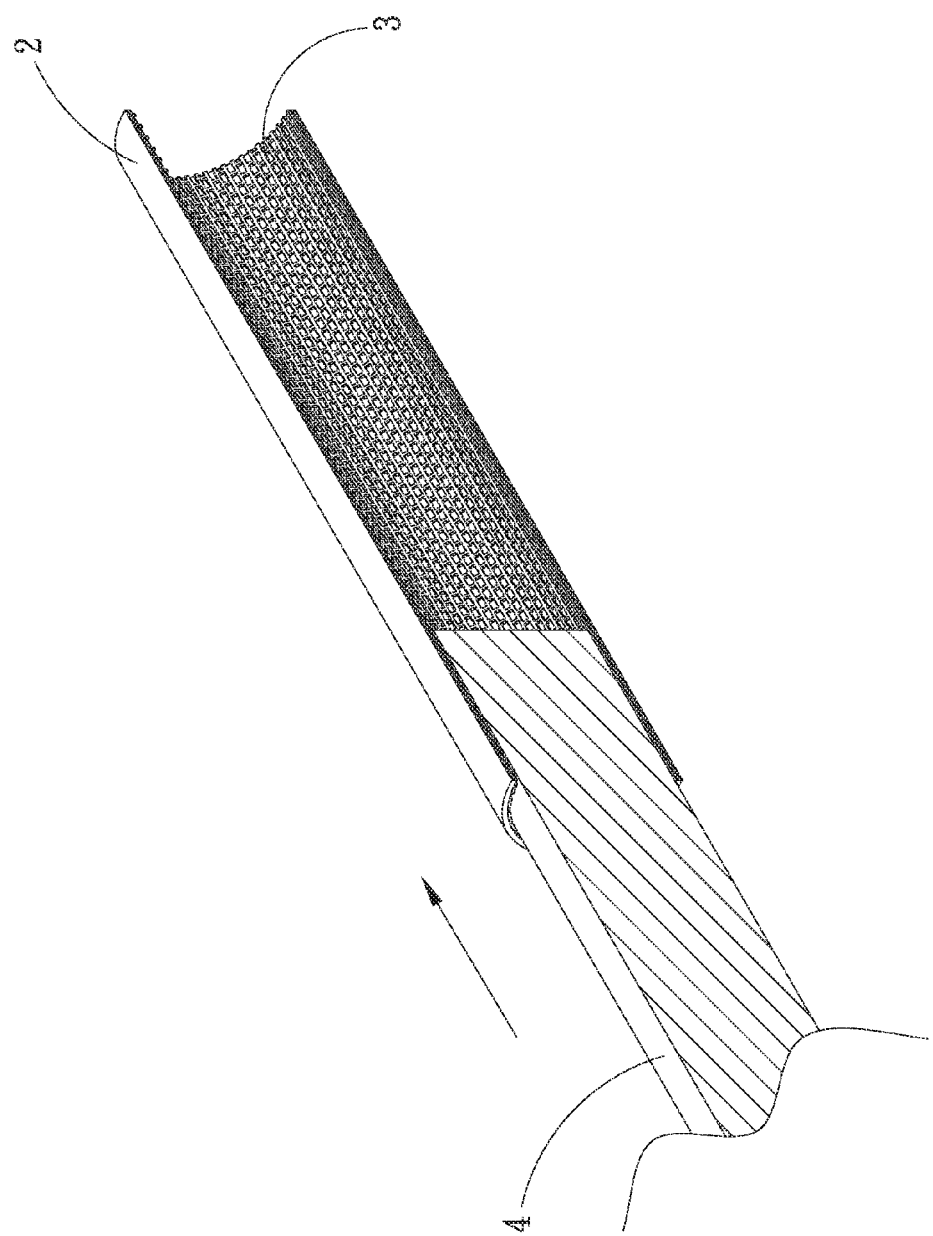
FIG. 5 is a perspective view showing a third step of the manufacturing method of thin heat pipe of the present invention.
Figure 7:
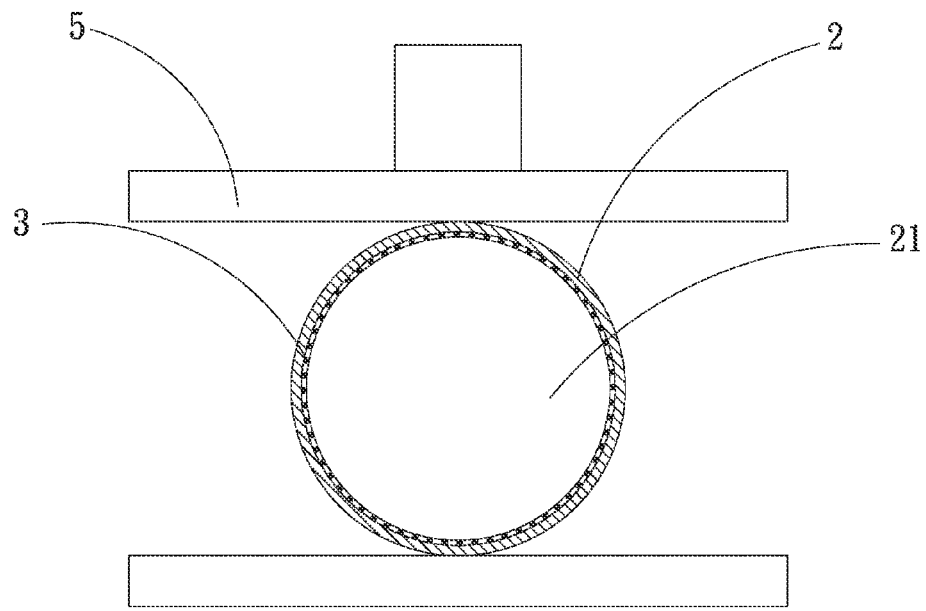
FIG. 7 is a perspective view showing a fifth step of the manufacturing method of thin heat pipe of the present invention.
Figure 8:
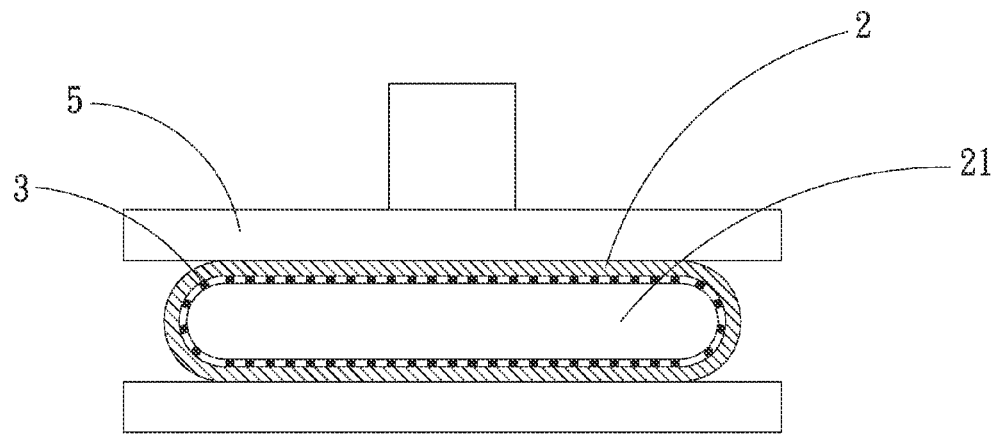
FIG. 8 is a perspective view showing a sixth step of the manufacturing method of thin heat pipe of the present invention.
Figure 9:
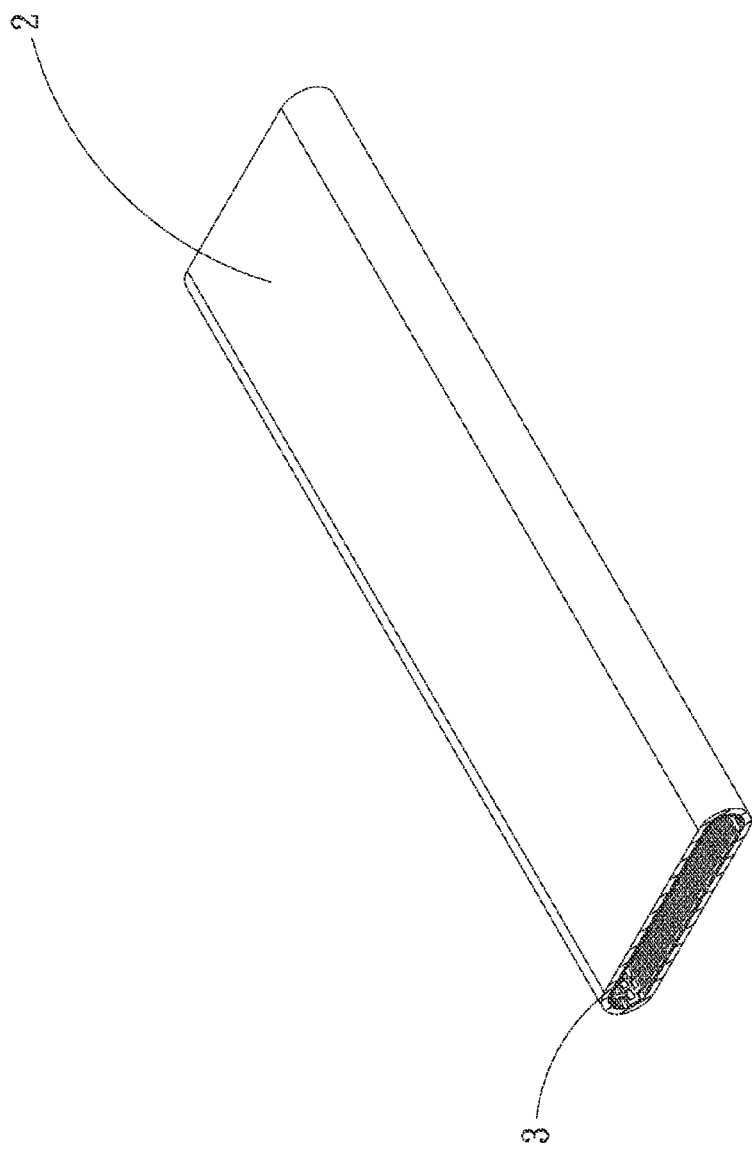
FIG. 9 is a perspective view of the thin heat pipe of the present invention.

Please refer to FIGS. 2 to 9. FIG. 2 is a flow chart of the manufacturing method of thin heat pipe of the present invention. FIG. 3 is a perspective view showing a first step of the manufacturing method of thin heat pipe of the present invention. FIG. 4 is a perspective view showing a second step of the manufacturing method of thin heat pipe of the present invention. FIG. 5 is a perspective view showing a third step of the manufacturing method of thin heat pipe of the present invention. FIG. 6 is a perspective view showing a fourth step of the manufacturing method of thin heat pipe of the present invention. FIG. 7 is a perspective view showing a fifth step of the manufacturing method of thin heat pipe of the present invention. FIG. 8 is a perspective view showing a sixth step of the manufacturing method of thin heat pipe of the present invention. FIG. 9 is a perspective view of the thin heat pipe of the present invention. The manufacturing method of thin heat pipe of the present invention includes steps of:

S1. providing a hollow tubular body and a mesh capillary structure, referring to FIGS. 2 and 3, a hollow tubular body 2 and a mesh capillary structure 3 being prepared, the hollow tubular body 2 and the mesh capillary structure 3 being made of metal material with good thermal conductivity, such as copper material or aluminum material or any other metal material with good thermal conductivity, in this embodiment, the metal material is, but not limited to, copper material;

S2. placing the mesh capillary structure into the tubular body, referring to FIGS. 2 and 4, the mesh capillary structure 3 being originally in the form of a sheet, the mesh capillary structure 3 having a proper width and a proper length in adaptation to an inner diameter of the tubular body 2, in this embodiment, the mesh capillary structure 3 being, but not limited to, curled to make two edges of the mesh capillary structure 3 connected with each other without overlapping for illustration purposes, then the mesh capillary structure 3 being fitted into a chamber 21 of the tubular body 2, after placed into the chamber 21, the mesh capillary structure 3 stretching to attach to an inner wall face of the tubular body 2;

S3. providing a tool and placing the tool into the mesh capillary structure, referring to FIGS. 2 and 5, a tool 4 being prepared, after the mesh capillary structure 3 is placed into the tubular body 2, the mesh capillary structure 3 stretching to attach to the inner wall face of the tubular body 2, in this embodiment, the tool 4 having a width in adaptation to the inner diameter of the mesh capillary structure 3, whereby after the tool 4 is placed into the mesh capillary structure 3, the mesh capillary structure 3 will fully tightly attach to the inner wall face of the tubular body 2;

S4. sintering the tubular body to make the mesh capillary structure sintered on the inner wall face of the tubular body and then taking out the tool, referring to FIGS. 2 and 6, the tubular body 2 with the mesh capillary structure 3 and the tool 4 therein being sintered to make the mesh capillary structure 3 fully tightly attached to the inner wall face of the tubular body 2, then the tool 4 being taken out of the mesh capillary structure 3;

S5. pressing and flattening the tubular body into a flat form by means of a mechanical processing apparatus, referring to FIGS. 2, 7 and 8, the tubular body 2 being pressed and flattened into a flat form by means of a mechanical processing apparatus, the mechanical processing apparatus being a press apparatus 5 or a rolling apparatus, in this embodiment, the mechanical processing apparatus being a press apparatus 5, the tubular body being placed on the press apparatus 5 and pressed and flattened into a flat form by means of pressing, at this time, the mesh capillary structure 3 in the tubular body 2 being simultaneously flattened along with the tubular body 2 and kept tightly attached to the inner wall face of the tubular body 2;

S6. vacuuming the tubular body and filling a working fluid into the tubular body, the chamber 21 of the flattened tubular body 2 being vacuumed and filled with a working fluid; and S7. sealing the tubular body, after vacuumed and filled with the working fluid, an open end of the tubular body 2 being sealed.

According to a second embodiment (not shown) of the manufacturing method of thin heat pipe of the present invention, steps S1~S4 are unchanged. The second embodiment is only different from the first embodiment in that instead, step S5 is vacuuming the tubular body and filling a working fluid into the tubular body and step S6 is sealing the tubular body, and step S7 is pressing and flattening the tubular body into a flat form by means of a mechanical processing apparatus.

In conclusion, according to the manufacturing method of thin heat pipe of the present invention, after pressed and flattened, the mesh capillary structure can still fully tightly attach to the inner wall face of the tubular body to keep the completeness of the tubular body and the completeness of the vapor-liquid circulation passageways in the heat pipe. Therefore, the mesh capillary structure is prevented from being deformed due to pressing. In this case, the thermal conductivity will not be affected and the heat conduction efficiency of the thin heat pipe can be greatly enhanced.

The present invention has been described with the above embodiments thereof and it is understood that many changes and modifications in the above embodiments can be carried out without departing from the scope and the spirit of the invention that is intended to be limited only by the appended claims.

What is claimed is:

1. A manufacturing method of thin heat pipe, comprising steps of:
    providing a hollow tubular body and a mesh capillary structure;
    placing the mesh capillary structure into the tubular body;
    providing a tool and placing the tool into the mesh capillary structure;
    sintering the tubular body to make the mesh capillary structure sintered on an inner wall face of the tubular body and then taking out the tool;
    after sintering the tubular body, pressing and flattening the tubular body into a flat form;
    vacuuming the tubular body and filling a working fluid into the tubular body; and
    sealing the tubular body by means of mechanical processing.

2. The manufacturing method of thin heat pipe as claimed in claim 1, wherein the mechanical processing is pressing or rolling.

3. The manufacturing method of thin heat pipe as claimed in claim 1, wherein in the step of placing the tool into the mesh capillary structure, the tool serves to make the mesh capillary structure fully tightly attached to the inner wall face of the tubular body.

4. The manufacturing method of thin heat pipe as claimed in claim 1, wherein in the step of pressing and flattening the tubular body into a flat form, the mesh capillary structure in the tubular body is simultaneously flattened along with the tubular body and kept tightly attached to the inner wall face of the tubular body.

5. A manufacturing method of thin heat pipe, comprising steps of:
    providing a hollow tubular body and a mesh capillary structure;
    placing the mesh capillary structure into the tubular body;
    providing a tool and placing the tool into the mesh capillary structure;
    sintering the tubular body to make the mesh capillary structure sintered on an inner wall face of the tubular body and then taking out the tool;
    vacuuming the tubular body and filling a working fluid into the tubular body;
    sealing the tubular body by means of mechanical processing; and
    after sintering the tubular body, pressing and flattening the tubular body into a flat form.

* * * * *